United States Patent [19]

Metz

[11] Patent Number: 4,471,319

[45] Date of Patent: Sep. 11, 1984

[54] FET BUFFER AMPLIFIER WITH IMPROVED NOISE REJECTION

[75] Inventor: Arthur J. Metz, Gervais, Oreg.

[73] Assignee: Tektronix, Inc., Beaverton, Oreg.

[21] Appl. No.: 392,847

[22] Filed: Jun. 28, 1982

[51] Int. Cl.³ ............................ H03F 1/26; H03F 3/16
[52] U.S. Cl. .................................. 330/149; 330/292; 330/300; 330/310
[58] Field of Search .............. 330/149, 300, 310, 311, 330/292

[56] References Cited

PUBLICATIONS

Erdi, "A 300 V/Ms Monolithic Voltage Follower" IEEE Journal of Solid–State Circuits, vol. SC-14, No. 6, Dec. 1979, pp. 1059–1065.

Primary Examiner—James B. Mullins
Attorney, Agent, or Firm—George T. Noe

[57] ABSTRACT

A buffer amplifier circuit is provided in which the effects of power supply noise is substantially reduced while contemporaneously exhibiting the attributes of low thermal distortion and high linearity. The amplifier comprises a source follower input stage which contains additional devices to absorb power supply variations, and an emitter follower output stage. A constant-current bias network includes means for bootstrapping the gate-to-drain capacitance of the input source follower.

3 Claims, 2 Drawing Figures

FET BUFFER AMPLIFIER WITH IMPROVED NOISE REJECTION

BACKGROUND OF THE INVENTION

It is often desirable to impose a field-effect transistor (FET) buffer amplifier in a signal path because such an amplifier exhibits a high input impedance to minimize loading a previous stage, and yet provides a low output impedance. Other requirements for such a buffer amplifier may include high linearity and low thermal distortion to maintain signal accuracy and fidelity, as well as high bandwidth capability. A buffer amplifier addressing these problems is the subject matter of U.S. Pat. No. 4,390,852 granted to John L. Addis, and assigned to the assignee of the present invention.

A problem not addressed by the foregoing prior art buffer amplifier, however, is the fact that FETs are susceptible to power supply noise because of channel length modulation effects of drain voltage, as well as other noise effects. In operating environments such as sweep-ramp generating circuits of oscilloscopes where the input gate of the buffer amplifier is connected directly to a sweep timing capacitor, very low noise and good linearity are essential.

SUMMARY OF THE PRESENT INVENTION

In accordance with the present invention, an improved FET buffer amplifier circuit is provided in which the effects of power supply noise is substantially reduced. The amplifier comprises a source follower input stage which contains additional devices to aid in absorbing power supply variations, and an emitter follower output stage. Additionally, the input stage includes a bootstrapping circuit driven by the emitter-follower output stage in such a manner that not only are thermal transient-response aberrations and self-heating thermal distortions eliminated, but power supply noise and ripple rejection is improved as well.

It is therefore one object of the present invention to provide an improved buffer amplifier which exhibits low thermal distortion, high linearity, and high power supply noise and ripple rejection.

It is another object of the invention to provide a novel bootstrapped FET buffer amplifier.

Other objects and advantages will become apparent to those having ordinary skill in the art from consideration of the following description when taken in conjuction with the accompanying drawings.

DETAILED DESCRIPTION OF THE INVENTION

Figure 1:
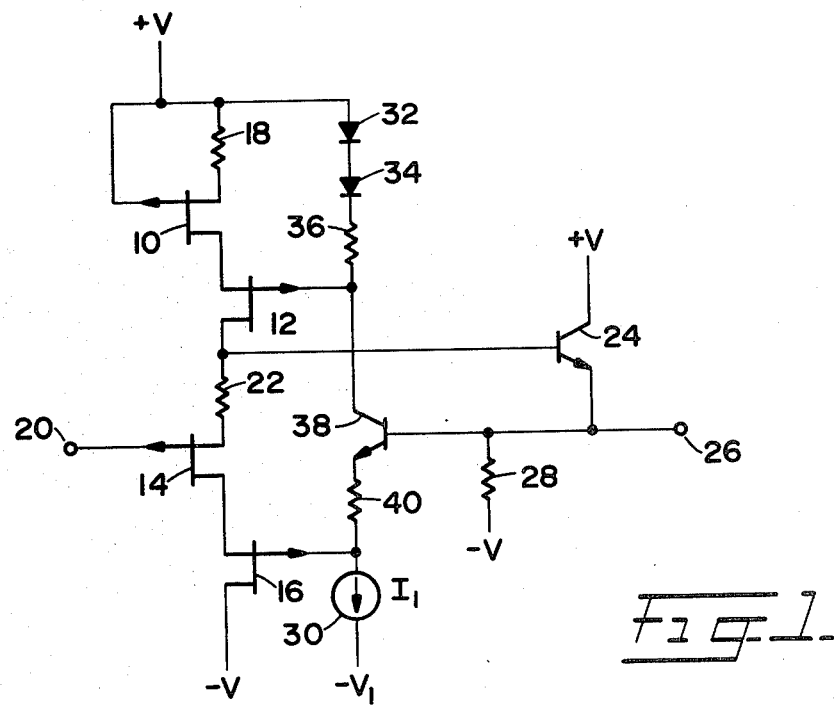
FIG. 1 is a schematic diagram of an FET buffer amplifier in accordance with the present invention.

Referring to FIG. 1, there is shown a buffer amplifier in accordance with the present invention in which the input stage is fabricated of four p-channel field-effect transistors 10, 12, 14, and 16 serially connected between a suitable positive and negative supply voltages +V and −V, respectively. N-channel devices could be used equally as well, with appropriate changes of polarity; however, the p-channel implementation shown in this embodiment is compatible with so-called BIFET integrated circuit processes. Furthermore, devices 12 and 16 could also be PNP bipolar transistors as well as FETs. A current-setting resistor 18 is connected between the source of FET 10 and the positive supply voltage +V to establish FET 10 as a constant current source for the input stage. Input signals are applied via an input terminal 20 to the gate of FET 14, which is operated as a source-follower amplifier. The source of FET 14 is connected through a resistor 22 to the base of a bipolar transistor 24, which operates as an emitter follower output stage to output signals on output terminal 26. The output stage emitter follower transistor 24 has its collector connected to the positive supply voltage +V and its emitter connected to the negative supply voltage −V through a resistor 28.

In the input stage, source follower FET 14 and current source FET 10 have matched physical and operating characteristics. FETs 12 and 16 preferably have physical and operating characteristics which are matched to those of FETs 10 and 14 to facilitate reduction of thermal transient-response aberrations and self-induced thermal distortion. Additionally, FETs 12 and 16 absorb power supply variations, such as ripple and noise, reducing such variations by a factor of $(1/\mu^2)$ where $\mu$ is the amplification factor of each FET.

A current sink 30 generates a current $I_1$ which flows through a first diode 32, a second diode 34, a resistor 36, a bipolar transistor 38, and a resistor 40 to establish the bias conditions of FETs 12 and 16. Diodes 32 and 34, which may suitably be diode-connected transistors, compensate the base-emitter junction voltage drops of transistors 24 and 38. Resistors 36 and 40 are chosen to have equal values, and with a substantially constant current $I_1$ therethrough, the drain-to-source voltages of FETs 10 and 14 are maintained essentially equal and constant so as to virtually eliminate self-heating thermal distortion. The base of transistor 38 is connected to the emitter of transistor 24, and thus transistor 38 is driven by the output signal, in turn driving the gate of FET 16, effectively bootstrapping FET 14 to eliminate thermal transient-response aberrations and distortion. FET 16 also serves to reduce the input capacitance because the drain voltage of FET 14 changes in unison with the signal voltage at the gate of FET 14, eliminating the voltage necessary to charge the gate-to-drain capacitance of FET 14. Also, since the values of resistors 36 and 40 are equal, any changes in the bias current $I_1$ effects both FETs 12 and 16 equally. Consequently, the drain-to-gate voltages of FETs 10 and 14 change by equal amounts as a function of current $I_1$, and therefore, any noise or variations in the current $I_1$ will not significantly impact buffer noise.

Figure 2:
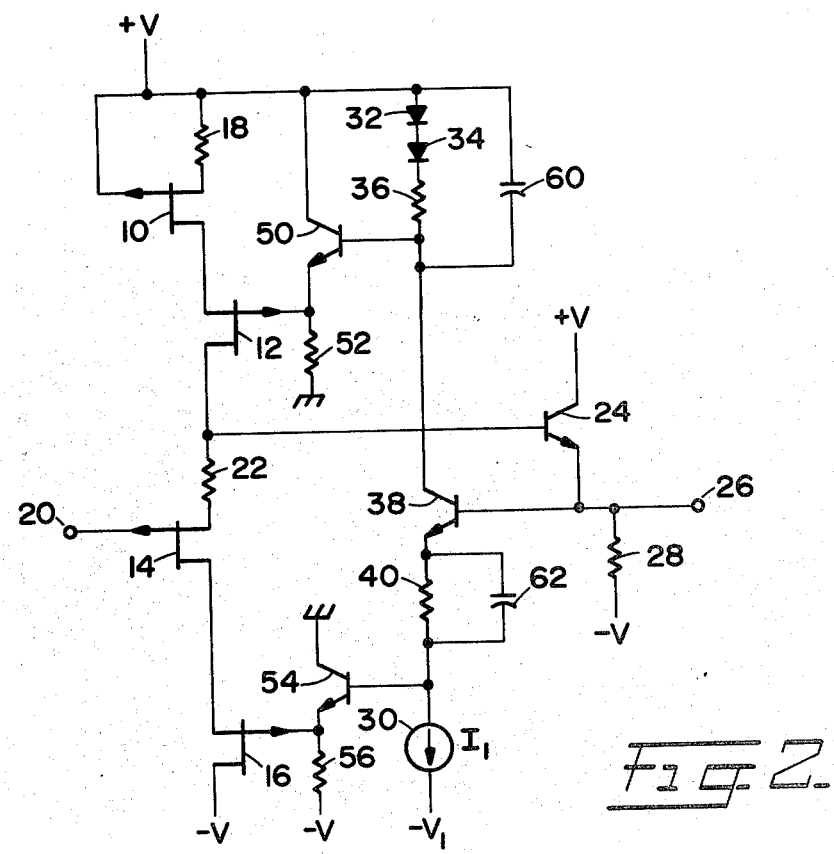
FIG. 2 is a schematic diagram of an FET buffer amplifier in accordance with the present invention in which additional components have been added for higher speed operation.

FIG. 2 shows a buffer amplifier similar to that discussed hereinabove in connection with FIG. 1, with additional components for high speed operation. Accordingly, the same reference symbols have been retained where appropriate, and only the differences will be described. Specifically, a first emitter follower transistor 50 and its associated emitter resistor 52 has been added between the collector of transistor 38 and the gate of FET 12, and a second emitter follower transistor 54 and its associated emitter resistor has been added between the junction of resistor 40 and current sink 30 to the gate of FET 16. These emitter followers provide a low-impedance driving source for the respective FET gates. In addition, small capacitors 60 and 62 have been added to improve the high-speed transient response, with capacitor 60 being connected across diodes 32 and 34 and resistor 36, and capacitor 62 being added across resistor 40.

While I have shown and described the preferred embodiments of my invention, it will be apparent to those skilled in the art that many changes and modifications may be made without departing from my invention in its broader aspects.

What I claim as being novel is:

1. A buffer amplifier, comprising:
    a source follower input stage comprising a field-effect transistor having source, gate, and drain electrodes, said gate connectable to a signal source;
    a pair of transistor devices for absorbing variations in power supply voltages applied to said source follower input stage, wherein a first one of said pair of transistor devices is serially connected in the source path of said field-effect transistor and a second one of said pair of transistor devices is serially connected in the drain path of said field-effect transistor;
    an emitter follower output transistor, the base of which is coupled to the source of said field-effect transistor; and
    bias means for said pair of transistor devices comprising a first resistor, a second resistor, and a constant current source connected in series, wherein said second resistor is coupled between the control electrodes of said pair of transistor devices.

2. A buffer amplifier in accordance with claim 1 wherein said bias means further comprises a bootstrap drive transistor connected in series between said first and second resistors, the base of which is connected to the emitter of said emitter follower output transistor, the collector of which is connected to said first resistor, and the emitter of which is connected to said second resistor.

3. A buffer amplifier in accordance with claim 2 further a pair of emitter follower transistors coupled between said bias means and said pair of transistor devices.

* * * * *